(12) United States Patent
Bhatt et al.

(10) Patent No.: US 8,734,698 B2
(45) Date of Patent: *May 27, 2014

(54) COMPOSITE SUBSTRATE CARRIER

(71) Applicant: Entegris, Inc., Billerica, MA (US)

(72) Inventors: Sanjiv M. Bhatt, Minnetonka, MI (US); Shawn D. Eggum, Lonsdale, MN (US)

(73) Assignee: Entegris, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/747,171

(22) Filed: Jan. 22, 2013

(65) Prior Publication Data
US 2013/0134624 A1  May 30, 2013

Related U.S. Application Data

(60) Division of application No. 13/301,422, filed on Nov. 21, 2011, now abandoned, which is a continuation of application No. 12/777,936, filed on May 11, 2010, now abandoned, which is a continuation of application No. 11/699,749, filed on Jan. 30, 2007, now abandoned, which is a continuation of application No. 11/092,528, filed on Mar. 29, 2005, now Pat. No. 7,168,564, which is a continuation of application No. 10/213,282, filed on Aug. 5, 2002, now Pat. No. 6,871,741, which is a continuation-in-part of application No. 09/317,989, filed on May 25, 1999, now Pat. No. 6,428,729.

(60) Provisional application No. 60/087,205, filed on May 28, 1998.

(51) Int. Cl.
*B29C 45/14* (2006.01)

(52) U.S. Cl.
USPC .......................................... 264/247; 264/254

(58) Field of Classification Search
USPC ................................................ 264/247, 254
See application file for complete search history.

(56) References Cited

U.S. PATENT DOCUMENTS 324,671 A   8/1885  Drake
3,615,124 A  10/1971  Blankenburg
(Continued)

FOREIGN PATENT DOCUMENTS

EP  0682357  11/1995
EP  0 692 817 A1  1/1996
(Continued)

OTHER PUBLICATIONS

UK Search Report, Application No. GB 9912453.9, Dated Oct. 28, 1999, 1 page.

(Continued)

*Primary Examiner* — Larry Thrower
(74) *Attorney, Agent, or Firm* — Christensen Fonder P.A.

(57) ABSTRACT

A composite wafer carrier according to an embodiment of the present invention comprises an operative portion formed of a first thermoplastic material and a support portion formed of a second different thermoplastic material. One of the operative portion and support portion is overmolded onto the other to form a gapless hermitic interface that securely bonds the portions together. The operative portion may be a transparent window, a portion of a latching mechanism or a wafer contact portion. Preferred embodiments of the invention include wafer carriers with said features, process carriers with said features and a process for manufacturing wafer carriers with said features.

2 Claims, 11 Drawing Sheets

(56) References Cited

U.S. PATENT DOCUMENTS

| | | | |
|---|---|---|---|
| 4,269,802 | A | 5/1981 | Linne |
| 4,373,113 | A | 2/1983 | Winkler et al. |
| 4,410,479 | A | 10/1983 | Cyriax |
| 4,532,970 | A | 8/1985 | Tullis et al. |
| 4,676,709 | A | 6/1987 | Bonora et al. |
| 4,739,882 | A | 4/1988 | Parikh et al. |
| 4,793,488 | A | 12/1988 | Gregerson |
| 4,815,912 | A | 3/1989 | Maney et al. |
| 4,872,554 | A | 10/1989 | Quernemoen |
| 4,949,848 | A | 8/1990 | Kos |
| 4,995,430 | A | 2/1991 | Bonora et al. |
| 5,024,329 | A | 6/1991 | Grohrock |
| 5,111,936 | A | 5/1992 | Kos |
| 5,186,338 | A | 2/1993 | Boutet |
| 5,321,258 | A | 6/1994 | Kinney |
| 5,370,142 | A | 12/1994 | Nishi et al. |
| 5,445,271 | A | 8/1995 | Kakizaki et al. |
| 5,452,795 | A | 9/1995 | Gallagher et al. |
| 5,469,963 | A | 11/1995 | Bonora et al. |
| 5,482,161 | A | 1/1996 | Williams et al. |
| 5,570,987 | A | 11/1996 | McKenna |
| 5,584,401 | A | 12/1996 | Yoshida |
| D378,873 | S | 4/1997 | Gregerson et al. |
| 5,686,040 | A | 11/1997 | Taber |
| 5,688,570 | A | 11/1997 | Ruttinger, Sr. |
| 5,706,946 | A | 1/1998 | Kakizaki et al. |
| 5,733,493 | A | 3/1998 | Katsuno et al. |
| 5,780,127 | A | 7/1998 | Mikkelsen |
| 5,788,082 | A | 8/1998 | Nyseth |
| 5,853,214 | A | 12/1998 | Babbs et al. |
| 5,860,550 | A | 1/1999 | Miller |
| 5,915,562 | A | 6/1999 | Nyseth et al. |
| 6,006,919 | A | 12/1999 | Betsuyaku |
| 6,010,008 | A | 1/2000 | Nyseth et al. |
| 6,032,802 | A | 3/2000 | Ejima et al. |
| 6,039,186 | A | 3/2000 | Bhatt et al. |
| 6,076,617 | A | 6/2000 | Berner |
| 6,082,540 | A | 7/2000 | Krampotich et al. |
| 6,103,164 | A | 8/2000 | Bebjak et al. |
| 6,216,874 | B1 | 4/2001 | Bores et al. |
| 6,267,245 | B1 | 7/2001 | Bores et al. |
| 6,273,261 | B1 | 8/2001 | Hosoi |
| 6,382,419 | B1 | 5/2002 | Fujimori et al. |
| 6,398,032 | B2 | 6/2002 | Fosnight et al. |
| 6,428,729 | B1 * | 8/2002 | Bhatt et al. .................. 264/254 |
| 6,432,849 | B1 | 8/2002 | Endo et al. |
| 6,520,338 | B2 | 2/2003 | Bores et al. |
| 6,644,477 | B2 | 11/2003 | Bores et al. |
| 6,808,668 | B2 | 10/2004 | Bhatt et al. |
| 6,871,741 | B2 | 3/2005 | Bhatt et al. |
| 2002/0020650 | A1 | 2/2002 | Fujimori et al. |
| 2003/0047476 | A1 | 3/2003 | Wu et al. |
| 2007/0193907 | A1 | 8/2007 | Bhatt et al. |

FOREIGN PATENT DOCUMENTS

| | | |
|---|---|---|
| EP | 0 744 765 A1 | 11/1996 |
| EP | 0 579 099 B1 | 1/1997 |
| FR | 2768135 | 3/1999 |
| JP | 3020287 | 1/1991 |
| JP | 05-192958 | 8/1993 |
| JP | 05-237868 | 9/1993 |
| JP | 05-269785 | 10/1993 |
| JP | 06-216227 | 8/1994 |
| JP | 07-269680 | 10/1995 |
| JP | 08-26380 | 1/1996 |
| JP | 08-55867 | 2/1996 |
| JP | 08-323801 | 12/1996 |
| JP | 09-002564 | 1/1997 |
| JP | 11-050336 | 2/1999 |
| JP | 10-70185 | 3/1999 |
| JP | 11-058443 | 3/1999 |
| JP | 11-271840 | 10/1999 |
| NL | 1006529 | 7/1997 |
| WO | WO-96/04176 | 2/1996 |
| WO | WO 96/09787 | 4/1996 |
| WO | WO 97/13710 | 4/1997 |

OTHER PUBLICATIONS

EPO Search Report, Patent No. FR 9906774, Dec. 7, 2000, 2 pages.

Decision of Appeal for Japanese Application No. 11-150366, Issued Jun. 17, 2008 (including granted claims), 5 pages.

Opposition Decision for Korean Application No. 1019990020023, Date of decision: Jun. 29, 2010, 49 pages.

Korean Intellectual Property Office Decision in Opposition, Korean Patent No. 543875, Opposition No. 10-2006-000112, Dec. 8, 2009, pp. 1-18.

* cited by examiner

COMPOSITE SUBSTRATE CARRIER

REFERENCES TO RELATED APPLICATIONS

This application is a division of Ser. No. 13/301,422, filed on Nov. 21, 2011, which is a continuation of Ser. No. 12/777,936, filed on May 11, 2010, which is a continuation of U.S. patent application Ser. No. 11/699,749, filed on Jan. 30, 2007, which is a continuation of U.S. patent application Ser. No. 11/092,528, filed on Mar. 29, 2005 and issuing as U.S. Pat. No. 7,168,564 on Jan. 30, 2007, which is a continuation of U.S. patent application Ser. No. 10/213,282, filed on Aug. 5, 2002 and issued as U.S. Pat. No. 6,871,741 on Mar. 29, 2005, which is a continuation-in-part of U.S. patent application Ser. No. 09/317,989, filed on May, 25, 1999 and issued as U.S. Pat. No. 6,428,729 on Aug. 6, 2002, which is based on U.S. Provisional Application No. 60/087,205, filed on May 28, 1998. Each of these applications is hereby incorporated by reference in their entirety.

FIELD OF THE INVENTION

This invention relates to devices for confining memory disk, silicon wafers, and the like for transport, storage, processing. More particularly the invention relates to a composite wafer or disk carrier.

BACKGROUND OF THE INVENTION

Certain carriers are utilized for transporting and storing batches of silicon wafers or magnetic disks before, during, and after processing of the disks or wafers. The wafers are processed into integrated circuits and the disks are processed into a magnetic storage disks for computers. Wafers when used herein refers to silicon wafers, magnetic substrates, and the like.

The processing of wafer disks into integrated circuit chips often involves several steps where the disks are repeatedly processed, stored and transported. Due to the delicate nature of the disks and their extreme value, it is vital that they are properly protected throughout this procedure. One purpose of a wafer carrier is to provide this protection. Additionally, since the processing of wafer disks is generally automated, it is necessary for disks to be precisely positioned relative to the processing equipment for the robotic removal and insertion of the wafers. A second purpose of a wafer carrier is to securely hold the wafer disks during transport.

Carriers are generally configured to axially arrange the wafers or disks in slots, and to support the wafers or disks by or near their peripheral edges. The wafers or disks are conventionally removable from the carriers in a radial direction upwardly or laterally. Carriers may have supplemental to covers, bottom covers, or enclosures to enclose the wafers or disks. There are a number of material characteristics, which are useful and advantageous for wafer carriers depending on the type of carrier and the particular part of the carrier at issue.

During processing of semiconductor wafers or magnetic disks, the presence of or generation of particulates presents very significant contamination problems. Contamination is accepted as the single biggest cause of yield loss in the semiconductor industry. As the size of integrated circuitry has continue to be reduced, the size of particles which can contaminate an integrated circuit has also become smaller making minimization of contaminants all the more critical. Contaminants in the form of particles may be generated by abrasion such as the rubbing or scraping of the carrier with the wafers or disks, with the carrier covers or enclosures, with storage racks, with other carriers, or with the processing equipment. A most desirable characteristic of a carrier is therefore a resistance to particle generation upon abrasion, rubbing, or scraping of the plastic molded material. U.S. Pat. No. 5,780,127 discusses various characteristics of plastics which are pertinent to the suitability of such materials for wafer carriers. Said patent is incorporated by reference.

Carrier materials should also have minimal outgassing of volatile components as these may leave films which also constitute a contaminant which can damage wafers and disks. The carrier materials must have adequate dimensional stability, that is rigidity, when the carrier is loaded.

Dimensional stability is necessary to prevent damage to the wafers or disks and to minimize movement of the wafers or disks within the carrier. The tolerances of the slots holding wafers and disks are typically quite small and any deformation of the carrier can directly damage the highly brittle wafers or can increase the abrasion and thus the particle generation when the wafers or disks are moved into, out of, or within the carrier. Dimensional stability is also extremely important when the carrier is loaded in some direction such as when the carriers are stacked during shipment or when the carriers integrate with processing equipment. The carrier material should also maintain its dimensional stability under elevated temperatures, which may be encountered during storage or cleaning Conventional carriers used in the semiconductor industry may develop and retain static charges. When a charged plastic part comes into contact with an electronic device or processing equipment it may discharge in a damaging phenomena known as electrostatic discharge (ESD). Additionally, statically charged carriers may attract and retain particles, particularly airborne particles. Also static buildup on carriers can cause semiconductor processing equipment to automatically shut down. It is most desirable to have a carrier with static dissipation characteristics to eliminate ESD and to avoid attracting particles.

Trace metals are a common ingredient or residue in many potential wafer carrier materials. Metal contamination must be considered in material selection and assembly methods of carriers. Anion contamination in carrier materials can cause contamination and corrosion problems.

Material used in carriers must also be chemically compatible to any chemicals which they may be subjected to. Although transport and storage wafer carriers are not intended for chemical use they must be resistant to cleaning solutions and commonly used solvents such as isopropyl alcohol. Process carriers are subject to ultra pure acids and other harsh chemicals.

Visibility of wafers within closed containers is highly desirable and may be required by end users. Transparent plastics suitable for such containers, such as polycarbonates, are desirable in that such plastic is low in cost but such plastics do not have desirable static dissipative characteristics nor desirable abrasion resistance. Other important characteristics include the cost of the carrier material and the ease of molding the material.

Carriers are typically formed of injection molded plastics such as polycarbonate (PC), acrylonitrile butadiene styrene (ABS), polypropylene (PP), polyethylene (PE), perfluoroalkoxy (PFA), and polyetheretherketone (PEEK). Fillers which have been added to injection molded plastics for static dissipation include carbon powder or fiber, metal fibers, metal coated graphite, and organic (amine-based) additives.

One common conventional wafer carrier used for transport and storage is a single molded part generally comprising a front end having an H-bar interface portion, a back end having a panel, and sidewalls having slots and lower curved or converging portions following the curvature of the wafers, and with an open top and open bottom. H-bar carriers will often be reused several times and then discarded. Between uses the carriers will typically be washed in hot wafer and/or other chemicals and they are then dried with hot air. It is a valuable characteristic to have a carrier that holds it shape when subjected to the higher temperatures associated with the cleaning, drying, transporting, and processing the carriers. Another conventional carrier is a box configured to hold an H-bar carrier. Such boxes are commonly known as work-in-process (WIP) boxes.

Another conventional carrier is a standardized mechanical interface (SMIF) pod which is comprised of a box which sealingly encloses an H-bar carrier which mechanically interfaces with process equipment. SMIF pods typically have a bottom opening door for accessing the H-bar carrier with wafers. Boxes are also known which have front opening doors for accessing the H-bar carrier.

Yet another conventional carrier is a front opening unified pod (FOUP), such as that disclosed in U.S. Pat. No. 6,010,008, to Nyseth et al, which is hereby incorporated by reference. FOUPs generally comprise a front opening container having a plurality of wafer supporting structures provided to the interior thereof. The wafer supporting structures maintain the wafers in an approximately horizontal orientation. A separate H-bar structure is not needed for FOUPs due to the presence of the internal support structures.

It must be recognized that the ideal material for one part of a carrier is typically not the ideal material for a different part of the same carrier. For example, PEEK is a material that has ideal abrasion resistance characteristics ideal for wafer contact portions but is difficult to mold and is, relative to other plastics, very expensive. Thus, PEEK may not be as good of a choice as other plastics, such a polycarbonate, for structural portions.

The only instances that different materials are known to have been used for different portions of disk carriers is by separately molding the different portions then assembling them into a carrier. Such assembly presents the disadvantage of surface to surface contact of different components which can create particle or contaminant entrapment areas that are difficult to clean. Moreover, molding of plastic parts often creates components that are not perfectly uniform. Thus assembly of components can leave gaps and typically such assembly requires mechanical fasteners of some sort. Additionally, the assembly process can generate particles. Moreover, the molding of different component parts and assembling same in a carrier involves labor and thus expense.

SUMMARY OF THE INVENTION

A composite wafer carrier according to an embodiment of the present invention comprises an operative portion formed of a first thermoplastic material and a support portion formed of a second different thermoplastic material. One of the operative portion and support portion is overmolded onto the other to form a gapless hermitic interface that securely bonds the portions together. The operative portion may be a transparent window, a portion of a latching mechanism or a wafer contact portion. Preferred embodiments of the invention include wafer carriers with said features, process carriers with said features and a process for manufacturing wafer carriers with said features.

A composite wafer carrier according to an embodiment of the present invention comprises a base portion formed of a first thermoplastic material. The base portion defines a plurality of slots for holding wafers in an axially aligned position. The base includes a transparent window thermophysically bonded to the base. The window allows a user to view wafers within the carrier. The base may also include a cover to seal the wafers within the wafer carrier. The cover includes a latching assembly. The latching assembly includes a bearing hub comprised of an abrasion resistant material that is provided to the door by way of an overmolding or co-injection molding operation.

An advantage and feature of particular embodiments of the present invention is that a carrier may be formed that provides optimal performance characteristics at minimal material and labor costs.

An additional feature and advantage of particular embodiments of the present invention is that there is no assembly of component parts while maintaining the advantages of using the combination of the two materials.

An additional feature and object of particular embodiments of the present invention is that a substantially integral carrier or component is created by the two plastic portions which are molded together.

Another advantage and feature of particular embodiments of the present invention is that the juncture between the two dissimilar materials is closed eliminating the potential entrapment of contaminants or other chemicals.

An additional object and advantage of particular embodiments of the present invention is that a viewing window may be provided to a portion of a wafer container.

Another object and feature of particular embodiments of the present invention is that the process can eliminate post molding conditioning of wafer carriers that otherwise could be necessary, such as annealing.

Another object and feature of particular embodiments of the present invention is that the overmolded components are gapless, hermetic and very secure.

DETAILED DESCRIPTION OF THE DRAWINGS

Figure 1:
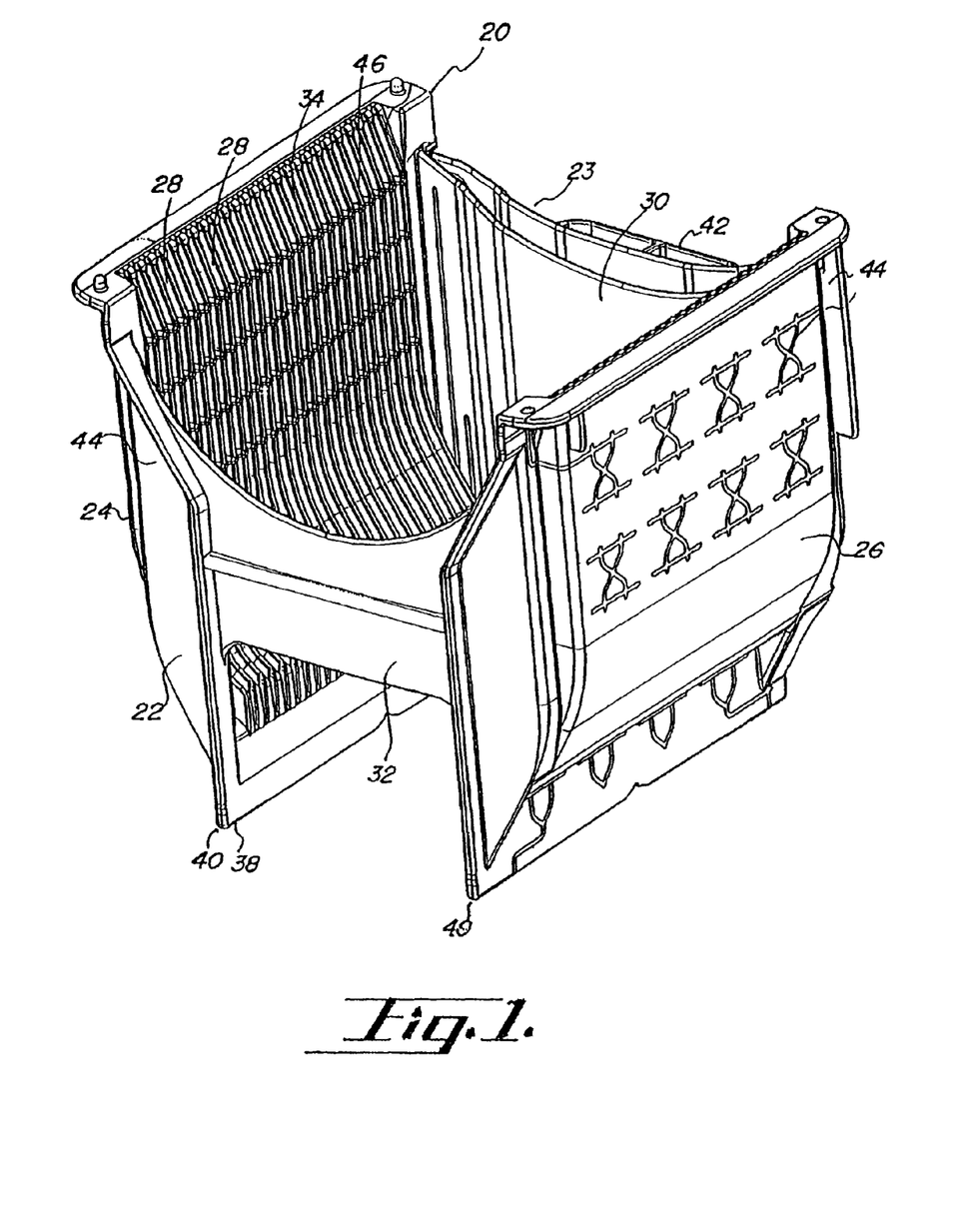
FIG. 1 is an H-bar wafer carrier according to an embodiment of the present invention.

Referring to FIG. 1 an H-bar wafer carrier is depicted and is generally indicated with the numeral 20. This carrier has, as in conventional H-bar carriers, a front 22, a back 23, side walls 24, 26, slots for receiving wafers 28, an open top 30, and a machine interface portion configured as an H-bar 32. Each of the slots is defined by a pair of wafer engaging teeth 34.

The traditional H-bar wafer carrier has in addition to the H-bar machine interface, a bottom machine interface 38 which will typically have four feet with a contact at the corners 40. Additionally, a robotic pick-up handle 42 and robotic flanges 44 also function as machine interfaces. The composite H-bar carrier generally has a support portion of first base portion 44 and a second overmolded portion 46 configured as wafer engaging portions 46. In this embodiment the wafer carrier 20 is a single integral component 20.

Figure 2:
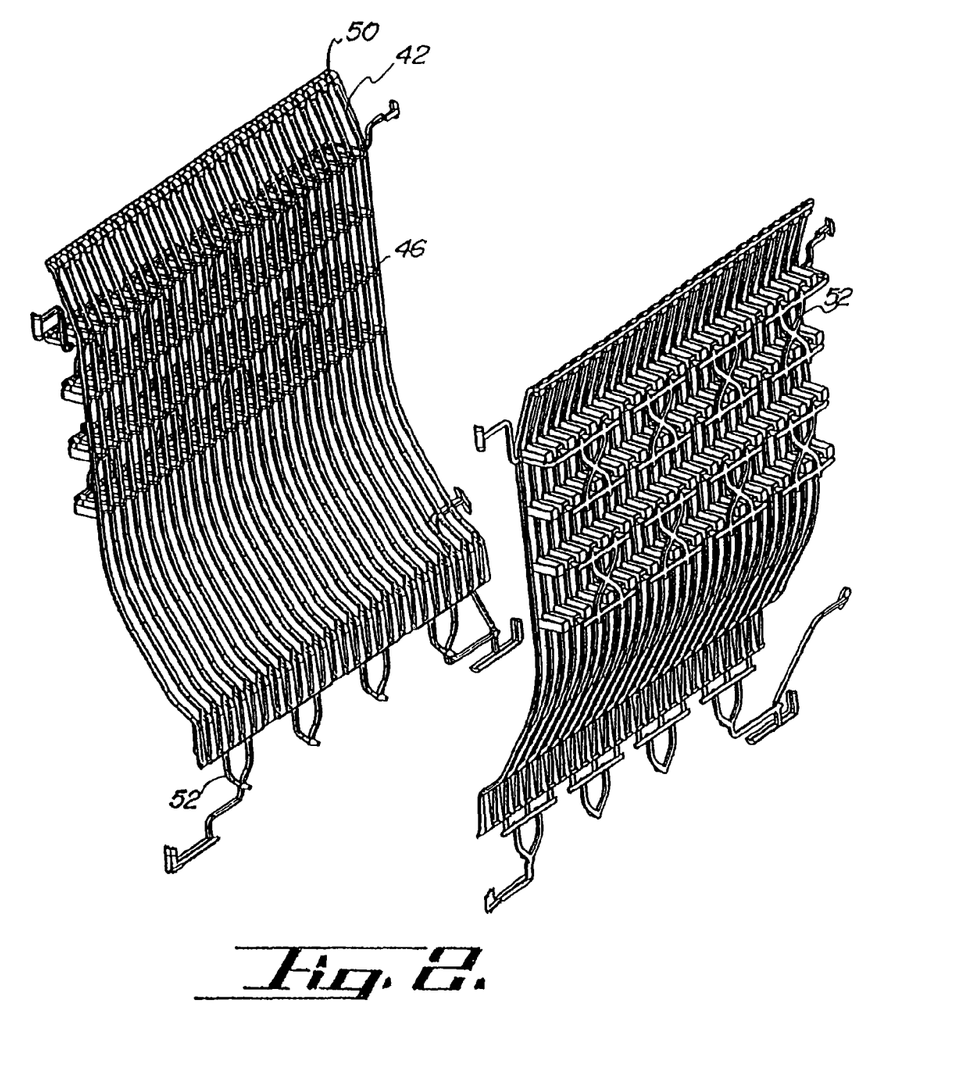
FIG. 2 is a figure showing the overmolded portion of the carrier of FIG. 1.

Referring to FIG. 2 the overmolded portion 50 is shown without the integral base portion and comprises an operative portion configured as wafer engaging portions 46 as well as incidental portions 52 which constitute flow paths for the molten overmold material during the mold process. This portion, as shown, reflects the configuration of the mold cavity for the overmolding.

In a preferred embodiment, the support or base portion 44 will be molded of an inexpensive dimensionally stable easily molded plastic such as polycarbonate or polycarbonate with carbon fiber filler. Then the overmolded portion can be molded from another melt processable crystalline plastic such as PEEK or PEEK with carbon fiber filler. These materials are dissimilar with respect to their morphological structure and their processing temperatures. Other pairs of morphologically dissimilar materials could also be utilized with similar advantages as provided by these materials. The amorphous material, polycarbonate, and the crystalline material, PEEK, form a thermophysical bond when the amorphous material comes in contact with the crystalline material in molten state. It is believed that the bond is formed by the virtue of the increase in surface energy of polymer glass at the interface. Therefore, when the hot amorphous melt comes in contact with the polymer glass, the polycarbonate, it elevates the surface energy of the polymer glass and as the hot melt is cooling down, it crystallizes at the interface. It is theorized that the crystallization process attributes to the bond of the two materials. The heat dissipates into the polymer glass at a very slow rate because of its low specific heat and thus the hot melt of PEEK cools at a lower rate increasing the crystallinity at the interface. When this process is carried out in an injection mold, the product formed will have higher crystallinity level at the interface of the polymer glass and crystal than at the interface of the polymer crystal and the mold steel because of the difference in specific heat of steel and polymer glass.

In a preferred embodiment, the polycarbonate, that is the polymer glass, the support portion, would be molded first and then placed back into an injection mold to mold the operative portion of PEEK over it. In this process the mold temperature is ideally kept below the glass transition temperature of polycarbonate which is approximately 149° C. to prevent distortion of the polycarbonate base portion. The wafer contact portion 50 is strategically positioned and configured such that the wafer shall never come into contact with the polycarbonate.

An alternative amorphous material in which a favorable bond has been observed is polyetherimide (PEI). This bond may have a chemical bonding component.

Various types of bonding components may be involved in the bonding of the overmolded portion to the base portion. It is believed that a thermophysical bond occurs when the molten overmolded material comes into contact with the non-molten base portion. Thermophysical bonding occurs when the molecules of the two portions come within three molecular radii.

Figures 3, 4, 5, 6, 7:
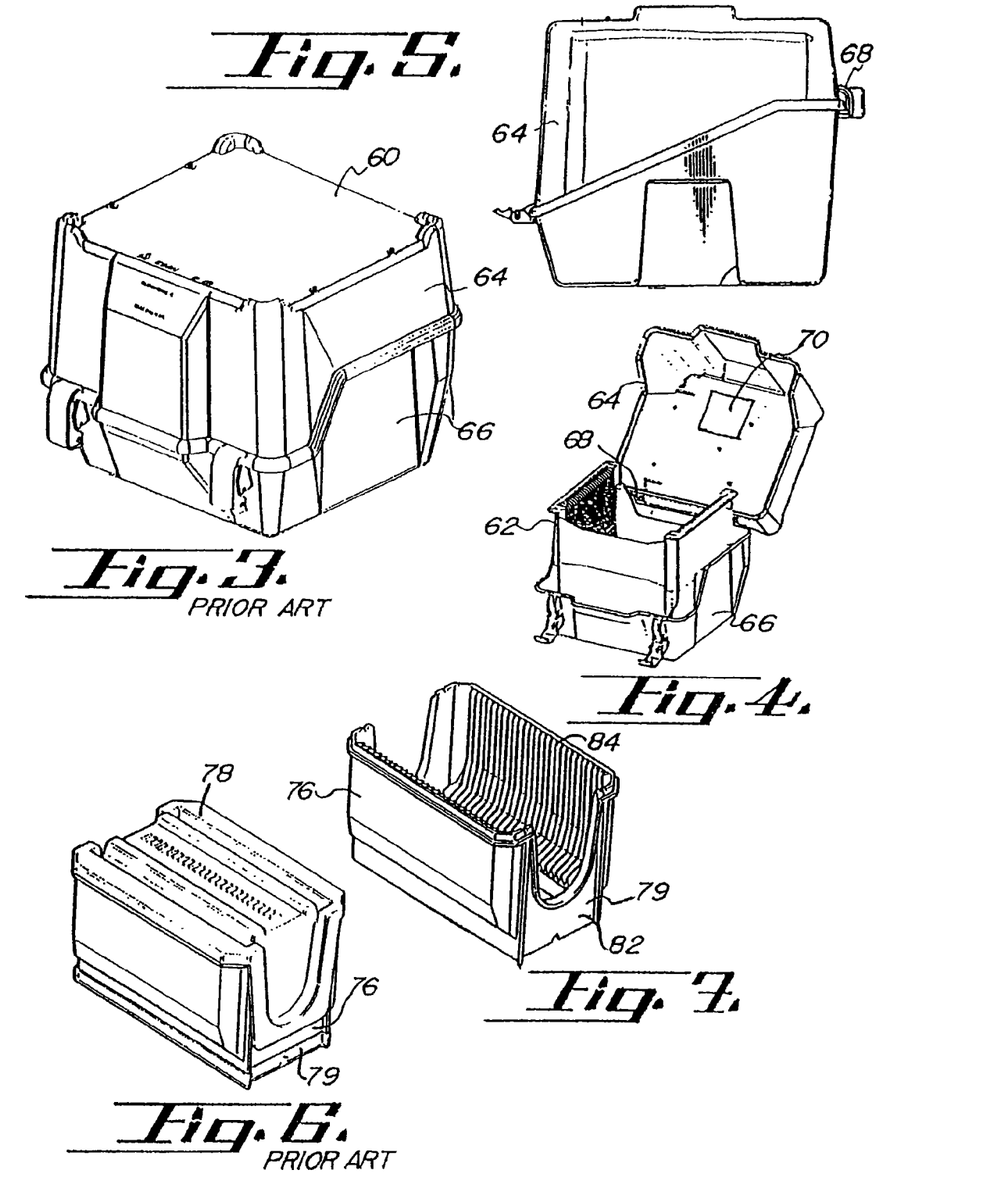
FIG. 3 is a perspective view of a prior art work-in-process (WIP) box according to an embodiment of the present invention.
FIG. 4 is a perspective view of a WIP box and an H-bar according to an embodiment of the present invention.
FIG. 5 is a side elevational view of a WIP box in according to an embodiment of the present invention.
FIG. 6 is a perspective view of a prior art disk shipper according to an embodiment of the present invention.
FIG. 7 is the body of a disk shipper in accordance with the invention.

Referring to FIGS. 3, 4, and 5, a work-in-process box is disclosed and is generally indicated with the numeral 60. Such a box will typically hold an H-bar wafer carrier 62 and has principal components of a top cover 64, a base portion 66, and an H-bar wafer carrier 62 engaged in and seated on the base portion 66. In this case, "carrier" references either the enclosure box or the enclosure box with the H-bar carrier. Several components may be formed in the overmold process to take advantage of the inherent features and advantages of the process and the invention. For example, in FIG. 5 the top section may be molded of polycarbonate with the hinge 68 overmolded with PEEK to adhere to the top cover section 64. Moreover, referring to FIG. 4 a polycarbonate window 70, an operative portion, may first be molded of a desired configuration and size and inserted into the mold for the cover portion 64, the support portion, with the balance of the cover portion overmolded to the polycarbonate window. The overmolding allows and provides a juncture of high integrity without the use of adhesives or mechanical fasteners.

Referring to FIGS. 6 and 7, a magnetic disk shipper carrier is typically comprised of a base portion 76, a top cover 78, and portion 79 may be advantageously formed according to the invention by first molding the support portion 82 of the base portion 76 and then injection molding the disk engaging portions 84. Again the support portion 82 may be formed of polycarbonate or similar material and the disk contacting portions may be formed of PEEK or similar material.

Figures 8, 9:
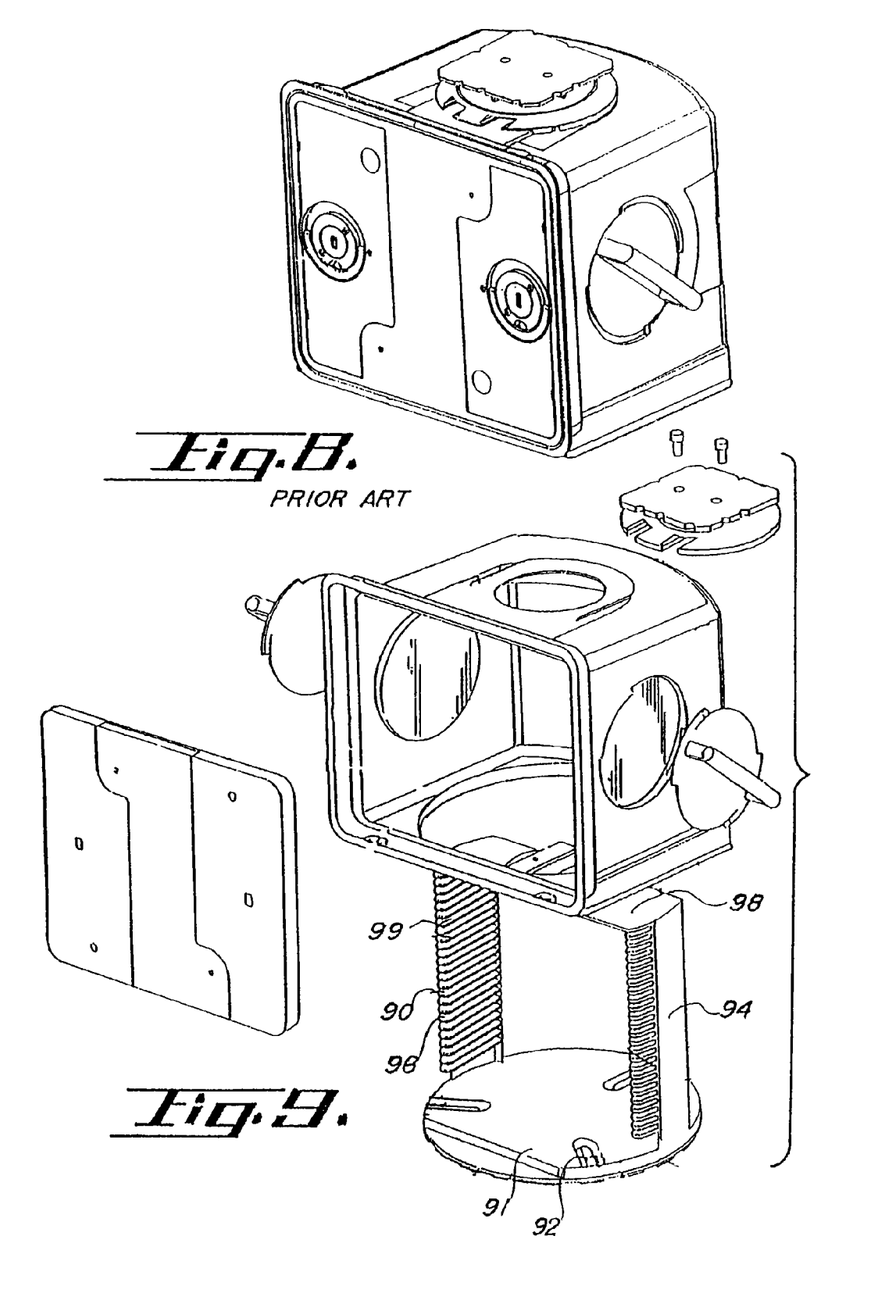
FIG. 8 is a prior art view of transport module.
FIG. 9 is an exploded view of a transport module similar to what is shown in FIG. 8 according to an embodiment of the present invention.

Referring to FIGS. 8 and 9, a transport module, which is intended for use with large semiconductor wafers, for example 300 mm, is shown. In this particular configuration the wafer support portion 90 is comprised of a base 91 with a machine interface portion 92, upright columns 94 with wafer support shelves 96, and a top portion 98. The wafer engaging shelves may have an overmolded portion 99, an operative portion, which is the portion that contacts wafers contained by the transport module. The machine interface also may utilized an overmolded portion where it contacts equipment.

Figure 12:
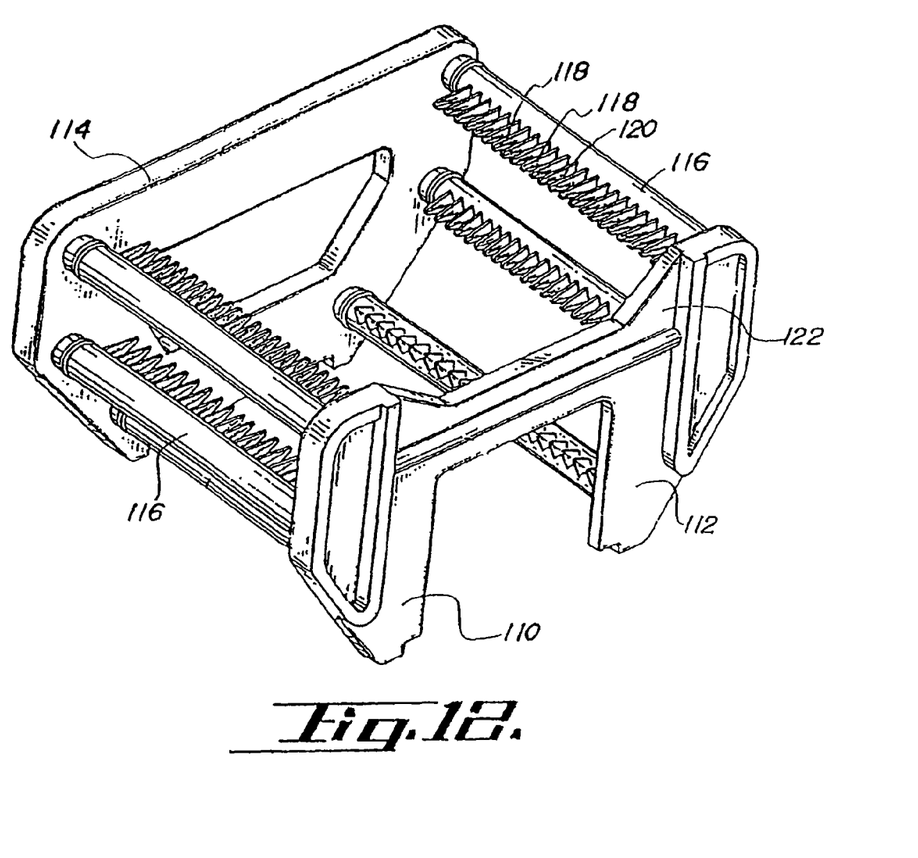
FIG. 12 is a perspective view of a process enhancement carrier according to an embodiment of the present invention.

Referring to FIG. 12, an alternate embodiment of a wafer carrier configured as a process enhancement carrier is shown and is generally indicated with the numeral 110. Such process enhancement carrier has base support portions 112 and 114 as well as arms 116 extending therebetween. Each of the arms has a plurality of teeth 118 which define slots 120 for holding wafers during processing steps. In this particular embodiment the exterior portion of the arms 116 and the teeth may he overmolded to a basic base framework 122 to provide the advantages of the invention.

Figure 10:
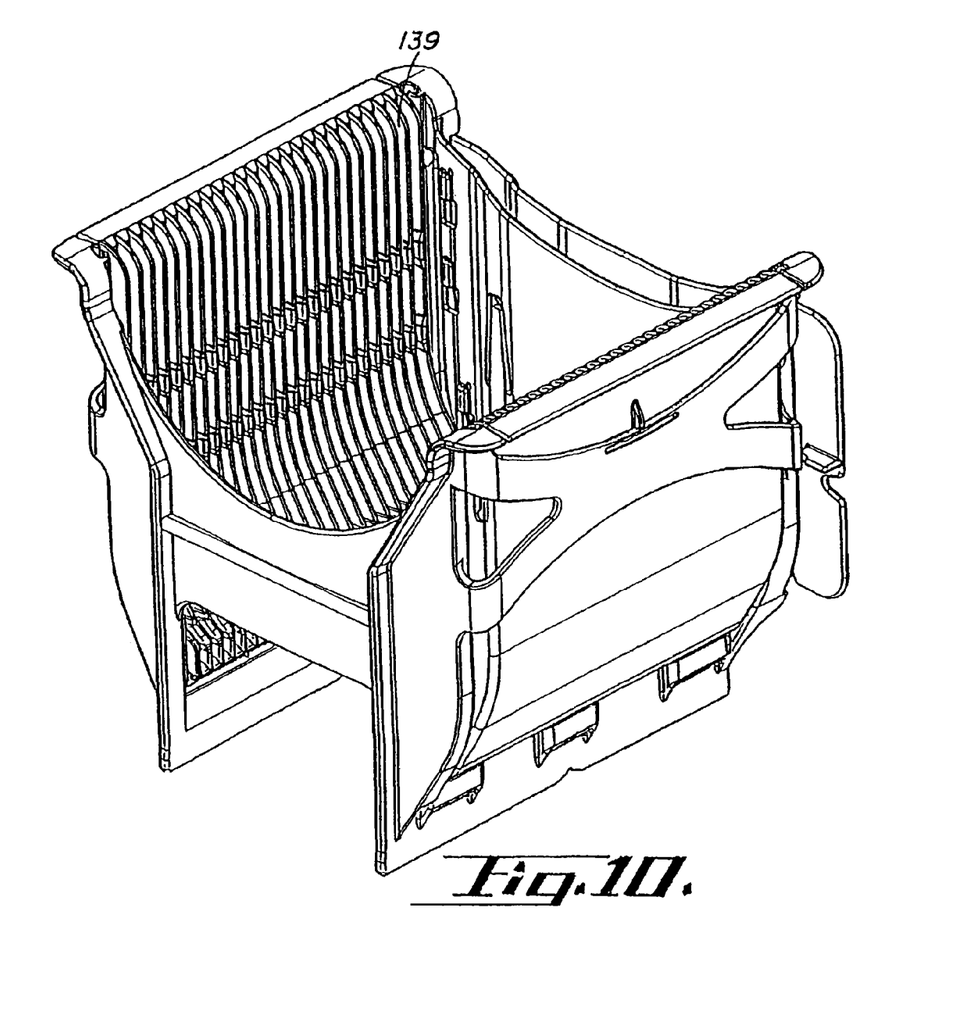
FIG. 10 is a perspective view of a composite wafer carrier according to an embodiment of the present invention.
Figure 11:
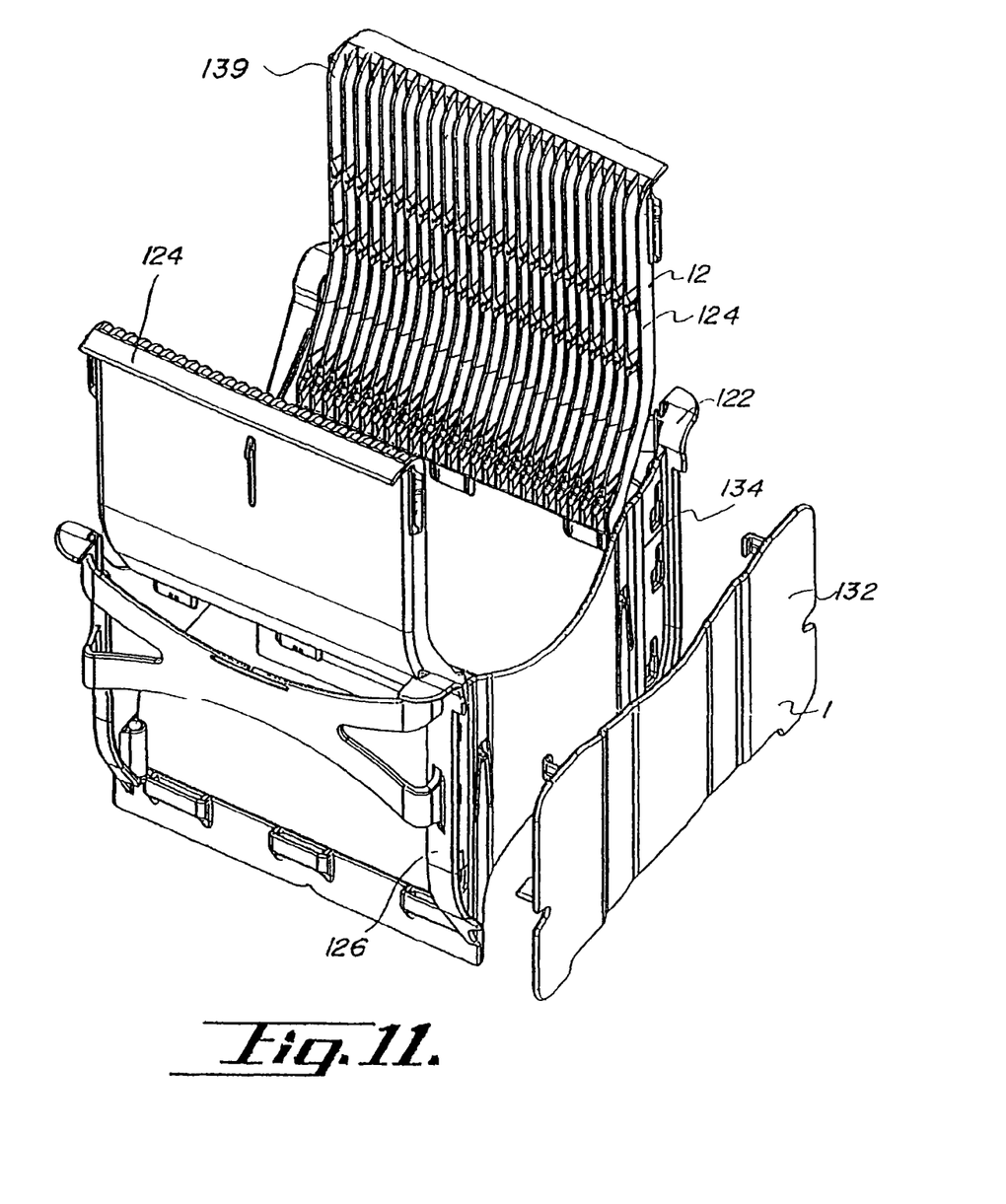
FIG. 11 is an exploded view of the wafer carrier of FIG. 10.

Referring to FIGS. 10 and 11, a composite wafer carrier made of assembled components 122 is disclosed. Components comprise sidewall portions 124 as well as a carrier framework 126. The side wall inserts 124 fit within and engage the framework 126 to form a secure and assembled wafer carrier. Additionally, a robot flange or machine interface 132 may be provided on the rear end 134 of the carrier. In this case each of the sidewall portions may have overmolded wafer-engaging portions 139 in order to minimize particle generation by the scrapping of the wafers. The overmolding can be under tighter dimensional control than the base portion to provide low tolerance positioning of the wafers.

Figure 14:
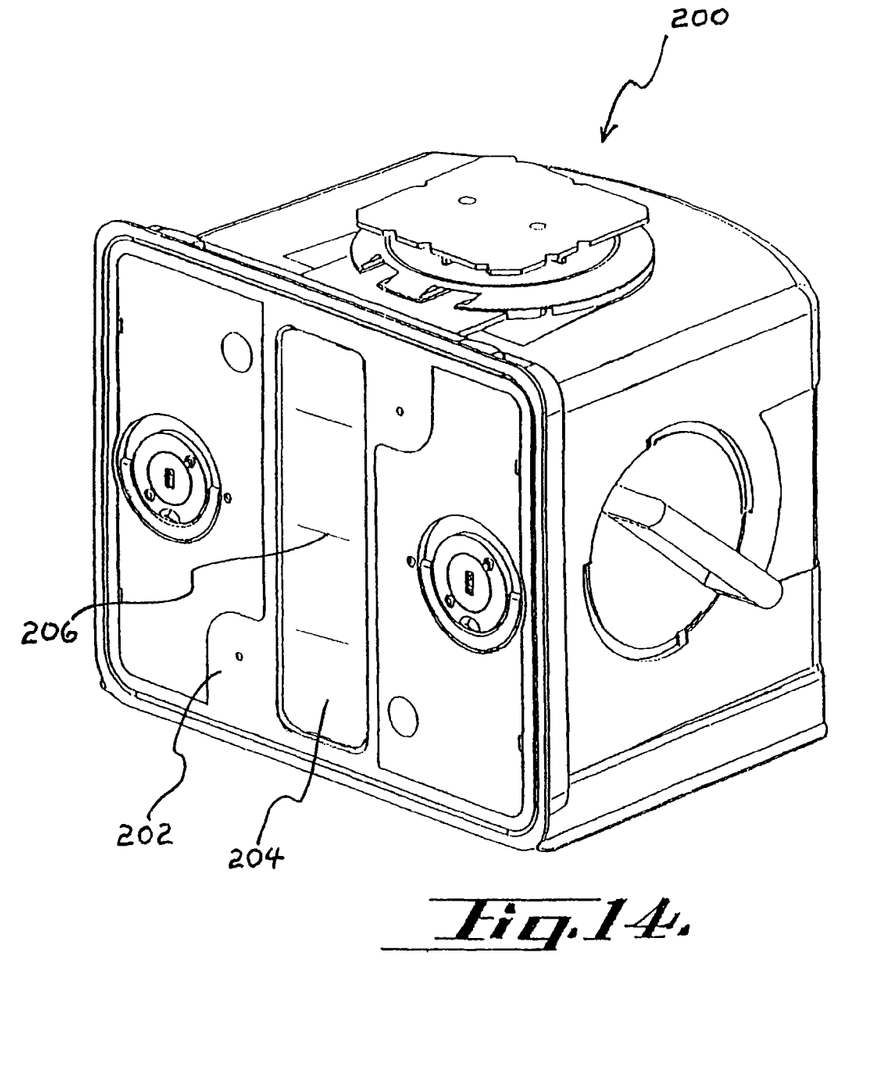
FIG. 14 is a perspective view of a front opening unified pod (FOUP) style wafer carrier having an insert molded transparent window according to an embodiment of the prior art.

Referring to FIG. 14, a composite wafer carrier according to an embodiment of the present invention is shown. The carrier 200 is a FOUP-type carrier having a front opening door 202. The door is provided with a transparent window 204, thereby permitting inspection of the wafers contained within the container 200. The presence of the window 204 allows the use of conductive plastics for the remainder of the door structure. Conventional conductive plastics known to those of skill in the art are not transparent. A plurality of gradations 206 may be provided to the window 204 for ease of quantifying the number of wafers in a given container 200. It should be appreciated that the window location and size may be varied without departing from the spirit or scope of the present invention.

Figure 15:
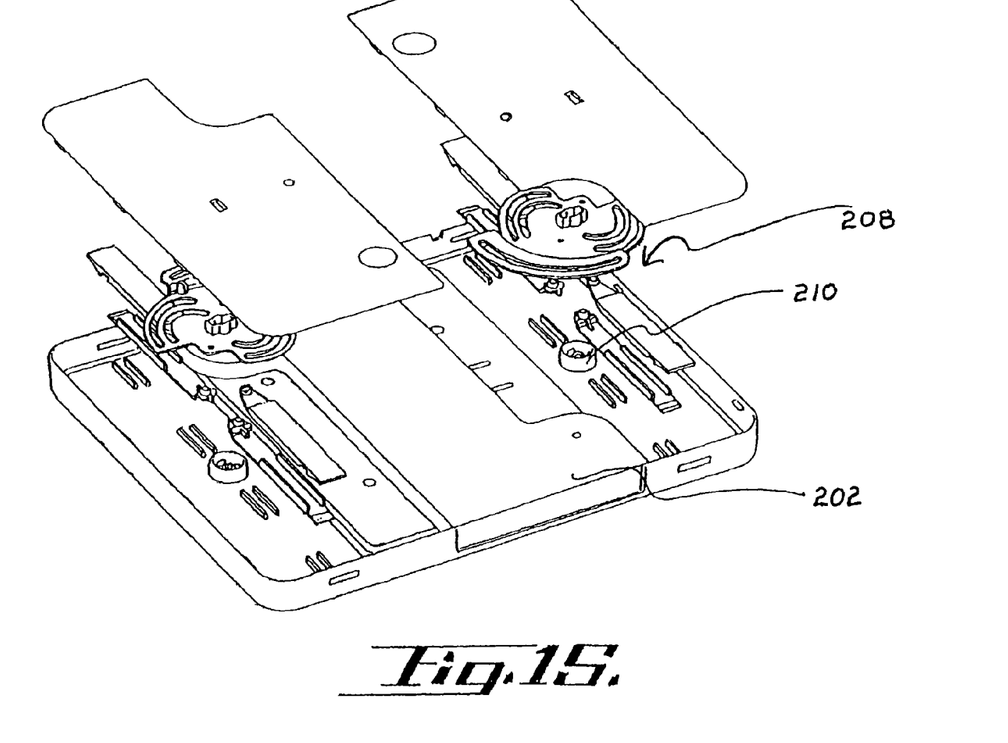
FIG. 15 is an assembly view of a door for a wafer carrier according to an embodiment of the present invention.

Referring to FIG. 15, an assembly view of a door latching mechanism is shown according to an embodiment of the present invention. U.S. Pat. No. 5,915,562, to Nyseth et al., discloses door lathing mechanisms in greater detail, and is hereby incorporated by reference. The door latch mechanism 208 of door 202 includes a bearing protrusion 210. The bearing protrusion is provided to the door 202 as part of an overmolding process, as described herein. The composite door allows for an abrasion resistant material, such as peek, to be used for the bearing post 210, while still using polycarbonate or conductive plastics for the remainder of the door 202.

Figure 16:
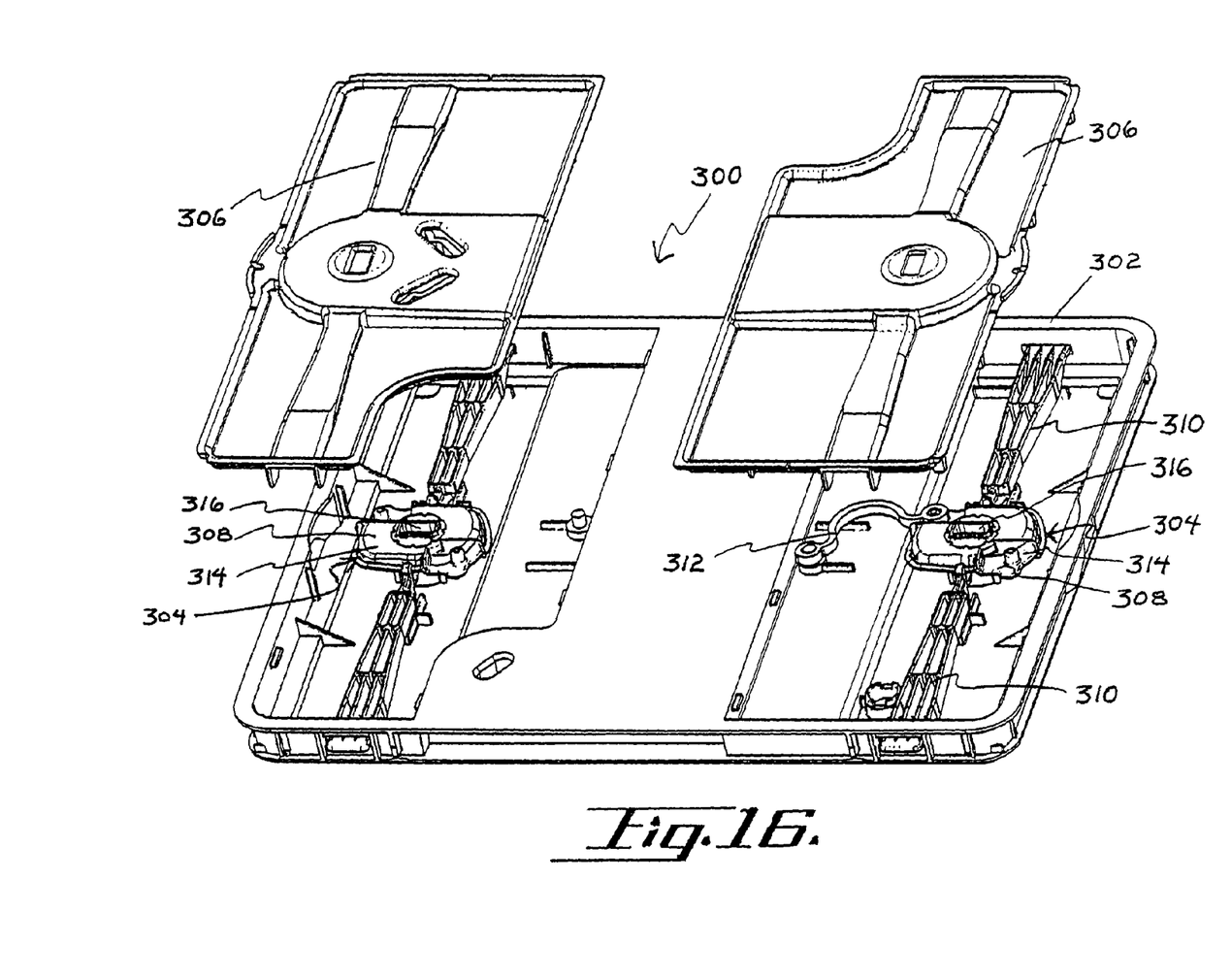
FIG. 16 is an perspective view of a cover for a wafer enclosure with a latching mechanism according to an embodiment of the present invention.

Referring to FIG. 16, a cover for a wafer enclosure is shown. The cover or door 300 comprises a body 302, door latch assemblies 304 disposed within the door 302 and latch assembly covers 306 for enclosing the latch assemblies 304 within the door 302. Each latch assembly comprises a latch actuator 308 disposed on a bearing post 210 (shown in FIG. 15), latch members 310 operably joined to the latch actuator 308 and a resilient latch assist device 312 also operatively joined to the latch actuator 308. The latch actuator 308 comprises a cammed wheel 314 and a key slot 316 disposed within the cammed wheel 314. The key slot 316 is configured to receive an actuator key, which is used by an operator or automated machinery to selectively latch or unlatch the cover 300.

Figure 13:
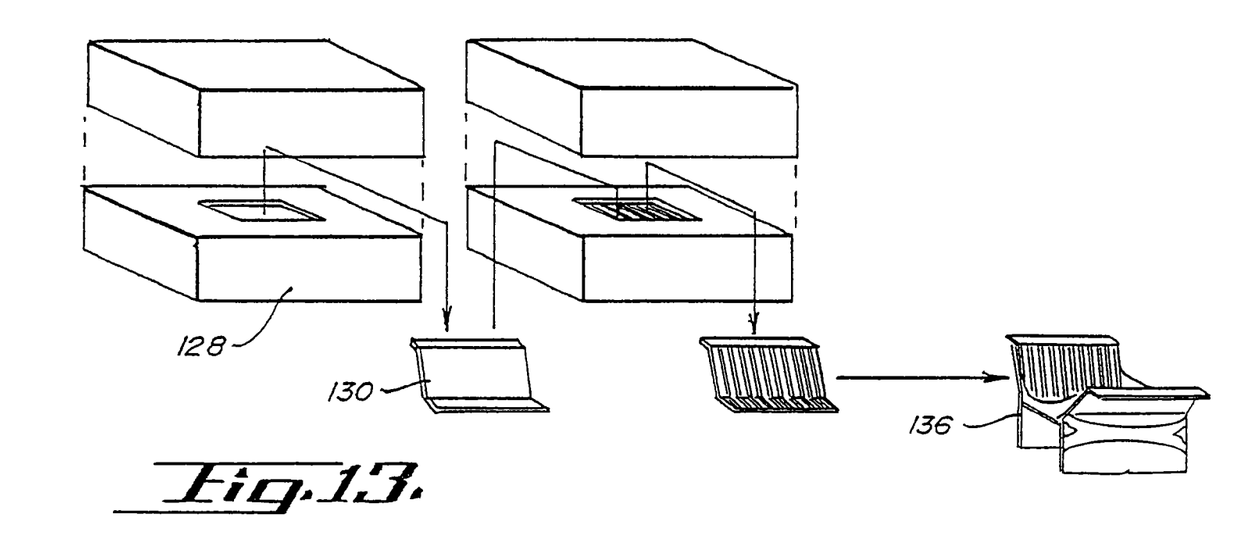
FIG. 13 is a schematic illustrating the methodology of an embodiment of the present invention.

Referring to FIG. 13 a schematic view illustrating a methodology for accomplishing the invention is shown. First a mold is provided for making a base or support portion, which can be a carrier framework or other carrier portion such as a sidewall base portion 130 as is illustrated. The base portion is molded and is then put into an additional mold or alternately the same mold with a mold insert removed. Then the mold is closed and additional overmolding material such as PEEK is injected into the mold cavity, which corresponds to the specific operative portions, which are being overmolded. Then the completed portion which comprises the support portion and the overmolded operative portion is removed. If such a base portion is a component part then the component part is assembled into a carrier 136. It should be recognized that the support portion may be overmolded on the operative portion.

In particular applications it may be suitable to have the first injection molded portion, the base portion to be relatively smaller volumetrically than the second, overmolded portion. In other applications a first material may be deposited at critical positions in a mold, for example the wafer contact areas, the material is allowed to solidify, and a second support portion is overmolded onto the first material without changing molds.

In other particular applications, the second material does not have to be allowed to solidify; the two materials may join while both are molten. This co-injection molding may not offer the precision in locating the interface between the first portion and the second portion; it does, however, eliminate the need for the extra mold and the steps of allowing the first portion to solidify, removing the portion from the mold, and placement of the first portion in a second mold.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

What is claimed is:

1. A process for manufacturing a wafer carrier component comprising the steps of:
   injection molding a transparent window portion of a first plastic material in a first mold;
   placing the molded transparent window portion in a second mold; and
   overmolding a wafer enclosure portion to the transparent window portion using a second plastic material in the second mold, wherein the wafer enclosure portion defines an enclosure for enclosing a plurality of wafers, wherein the second plastic material is different from the first plastic material, and wherein the transparent window portion is secured within the wafer enclosure portion without mechanical fasteners between the wafer enclosure and the transparent window portion.

2. The process for manufacturing a wafer carrier of claim 1, further comprising the step of selecting the first plastic and the second plastic such that when the second plastic is overmolded to the first plastic a gapless hermetic interface is formed.

* * * * *

UNITED STATES PATENT AND TRADEMARK OFFICE
CERTIFICATE OF CORRECTION

PATENT NO. : 8,734,698 B2  
APPLICATION NO. : 13/747171  
DATED : May 27, 2014  
INVENTOR(S) : Bhatt et al.

Page 1 of 1

It is certified that error appears in the above-identified patent and that said Letters Patent is hereby corrected as shown below:

On the Title Page, Item "(72)", under "Inventors", delete "Minnetonka, MI" and insert -- Minnetonka, MN --, therefor.

Signed and Sealed this  
Sixth Day of January, 2015

Michelle K. Lee  
*Deputy Director of the United States Patent and Trademark Office*